US012040277B2

United States Patent
Lee et al.

(10) Patent No.: US 12,040,277 B2
(45) Date of Patent: Jul. 16, 2024

(54) ELECTRONIC DEVICES AND METHODS OF MANUFACTURING ELECTRONIC DEVICES

(71) Applicant: Amkor Technology Singapore Holding Pte. Ltd., Valley Point (SG)

(72) Inventors: Young Ju Lee, Incheon (KR); Young Jae Cho, Incheon (KR); Ji Yeon Ryu, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 397 days.

(21) Appl. No.: 17/318,179

(22) Filed: May 12, 2021

(65) Prior Publication Data

US 2022/0367365 A1    Nov. 17, 2022

(51) Int. Cl.
| | | |
|---|---|---|
| *H01L 23/538* | (2006.01) | |
| *H01L 23/522* | (2006.01) | |
| *H01L 23/532* | (2006.01) | |

(52) U.S. Cl.
CPC ...... *H01L 23/5384* (2013.01); *H01L 23/5223* (2013.01); *H01L 23/53204* (2013.01); *H01L 23/5329* (2013.01)

(58) Field of Classification Search
CPC ............... H01L 23/481; H01L 23/5384; H01L 23/5223; H01L 23/53204; H01L 23/5329; H01L 25/0657; H01L 21/76898
See application file for complete search history.

(56) References Cited

U.S. PATENT DOCUMENTS

| | | | | |
|---|---|---|---|---|
| 10,276,514 | B1* | 4/2019 | Wang | H01L 23/585 |
| 10,854,527 | B2* | 12/2020 | Lu | H01L 24/32 |
| 2010/0252934 | A1* | 10/2010 | Law | H01L 21/76898 |
| | | | | 257/E21.597 |
| 2019/0122931 | A1* | 4/2019 | Huang | H01L 24/80 |
| 2021/0066192 | A1* | 3/2021 | Chen | H01L 21/56 |
| 2021/0202336 | A1* | 7/2021 | Chang | H01L 24/32 |
| 2021/0202440 | A1* | 7/2021 | Chang Chien | H01L 23/481 |
| 2021/0384122 | A1* | 12/2021 | Leng | H01L 28/10 |
| 2022/0238448 | A1* | 7/2022 | Halim | H01L 23/5384 |
| 2022/0278067 | A1* | 9/2022 | Tseng | H01L 23/585 |
| 2022/0367306 | A1* | 11/2022 | Chen | H01L 25/18 |

* cited by examiner

*Primary Examiner* — Jaehwan Oh
*Assistant Examiner* — John M Parker
(74) *Attorney, Agent, or Firm* — Kevin B. Jackson

(57) ABSTRACT

In one example, an electronic device includes a substrate with a substrate front side, a substrate rear side opposite to the substrate front side, a substrate body, and conductive vias extending through the substrate body from the substrate front side to the substrate rear side. A first construct is over the substrate front side and includes a first dielectric structure and first conductors embedded in the first dielectric structure and coupled to the conductive vias. A second construct is over the substrate rear side and includes a second dielectric structure and second conductors embedded in the second dielectric structure and coupled to the conductive vias. One or more of the first conductors or the second conductors define one or more passive devices. Other examples and related methods are also disclosed herein.

20 Claims, 15 Drawing Sheets

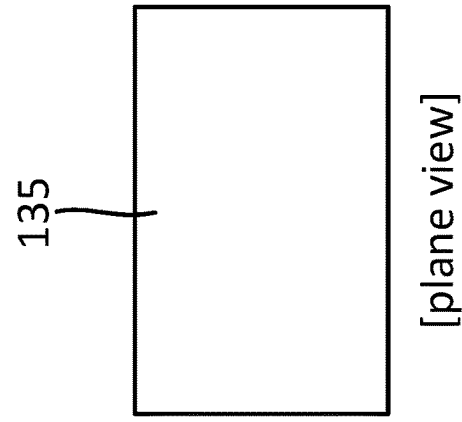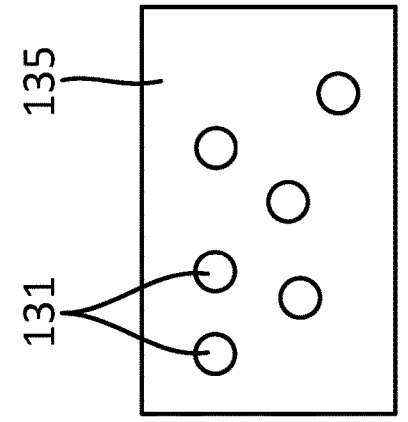
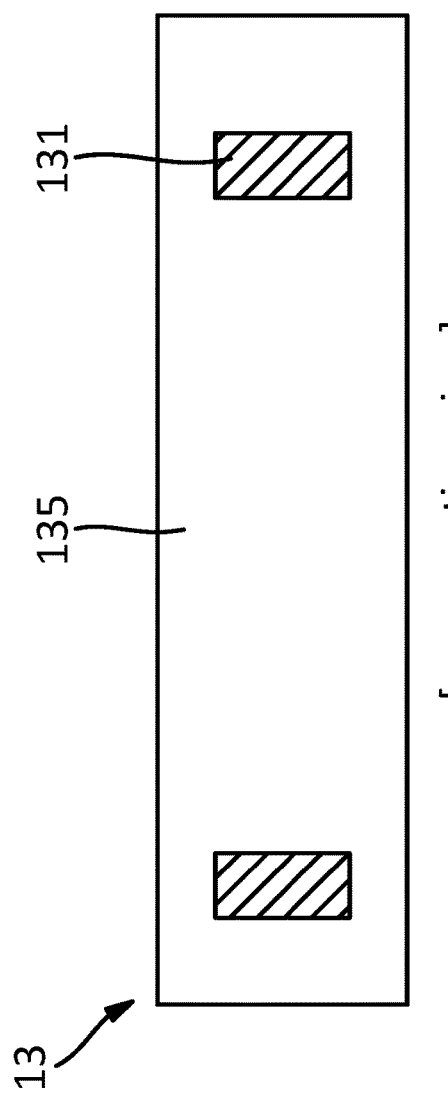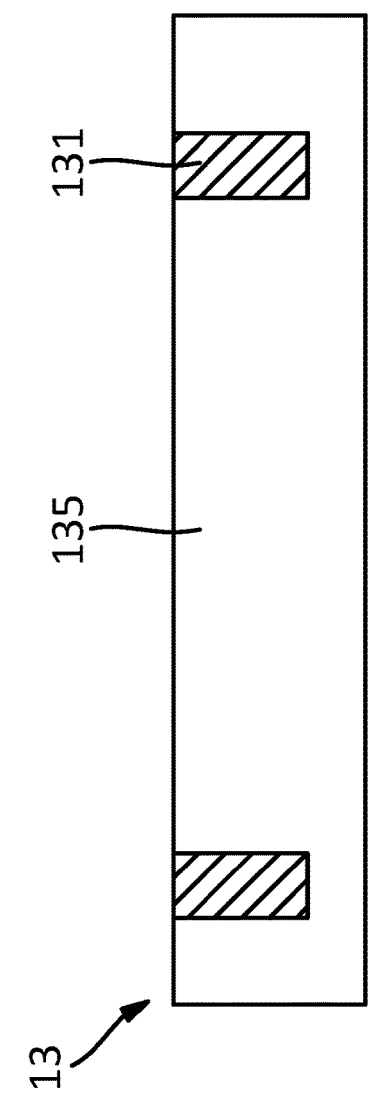
FIG.2A
FIG.2B

[plane view]

[cross section view]

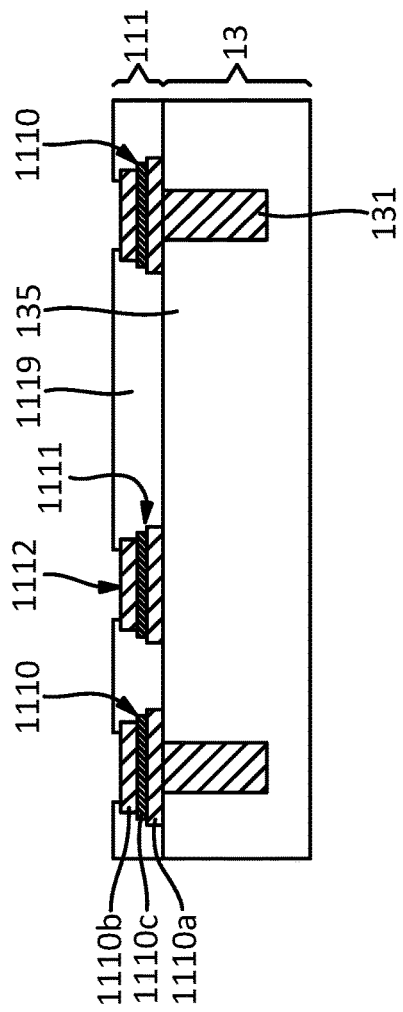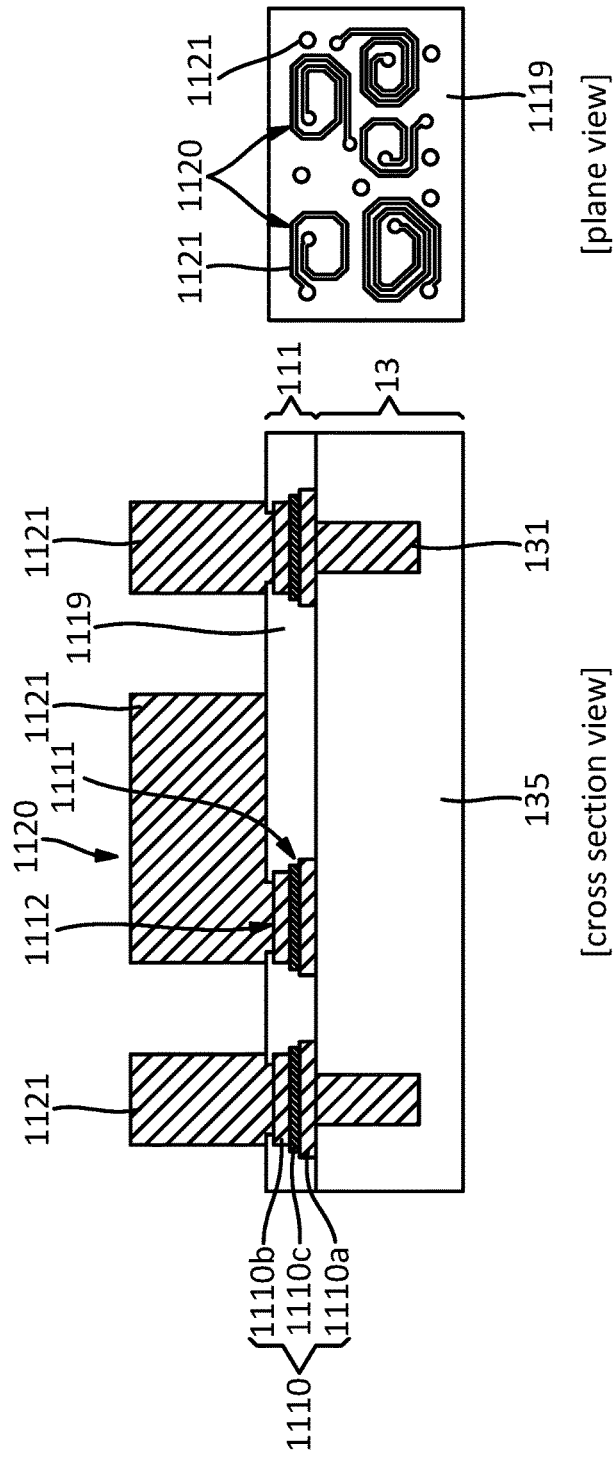

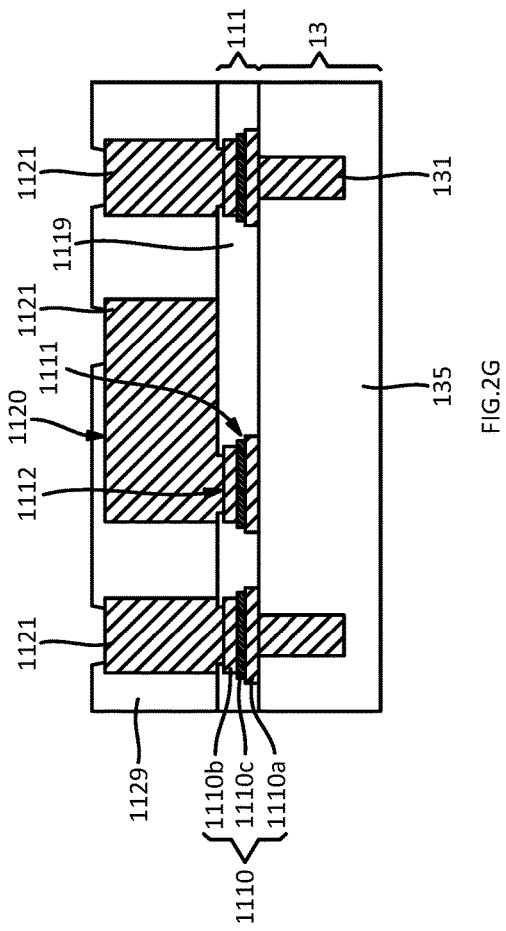
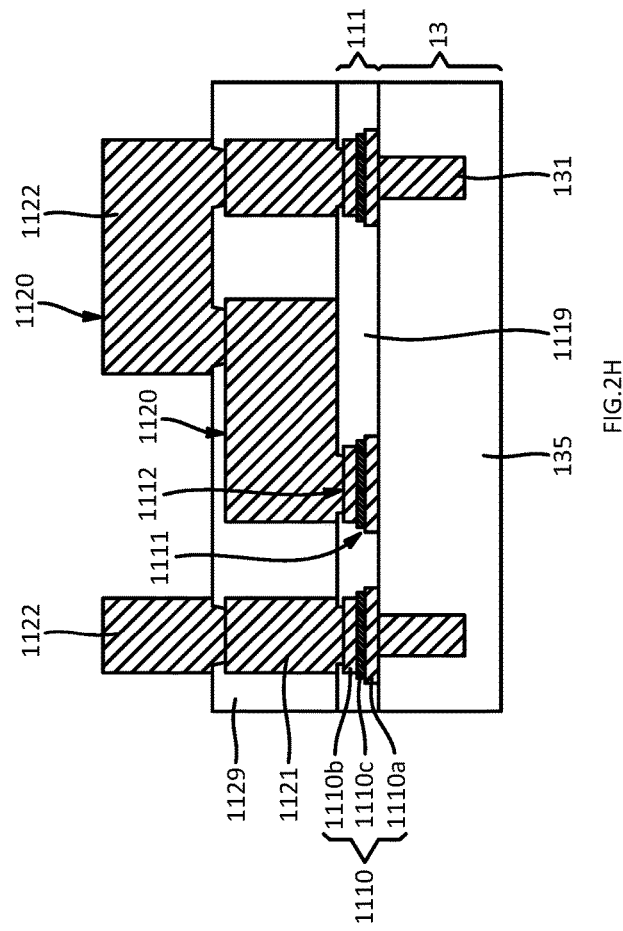
FIG.2G
FIG.2H

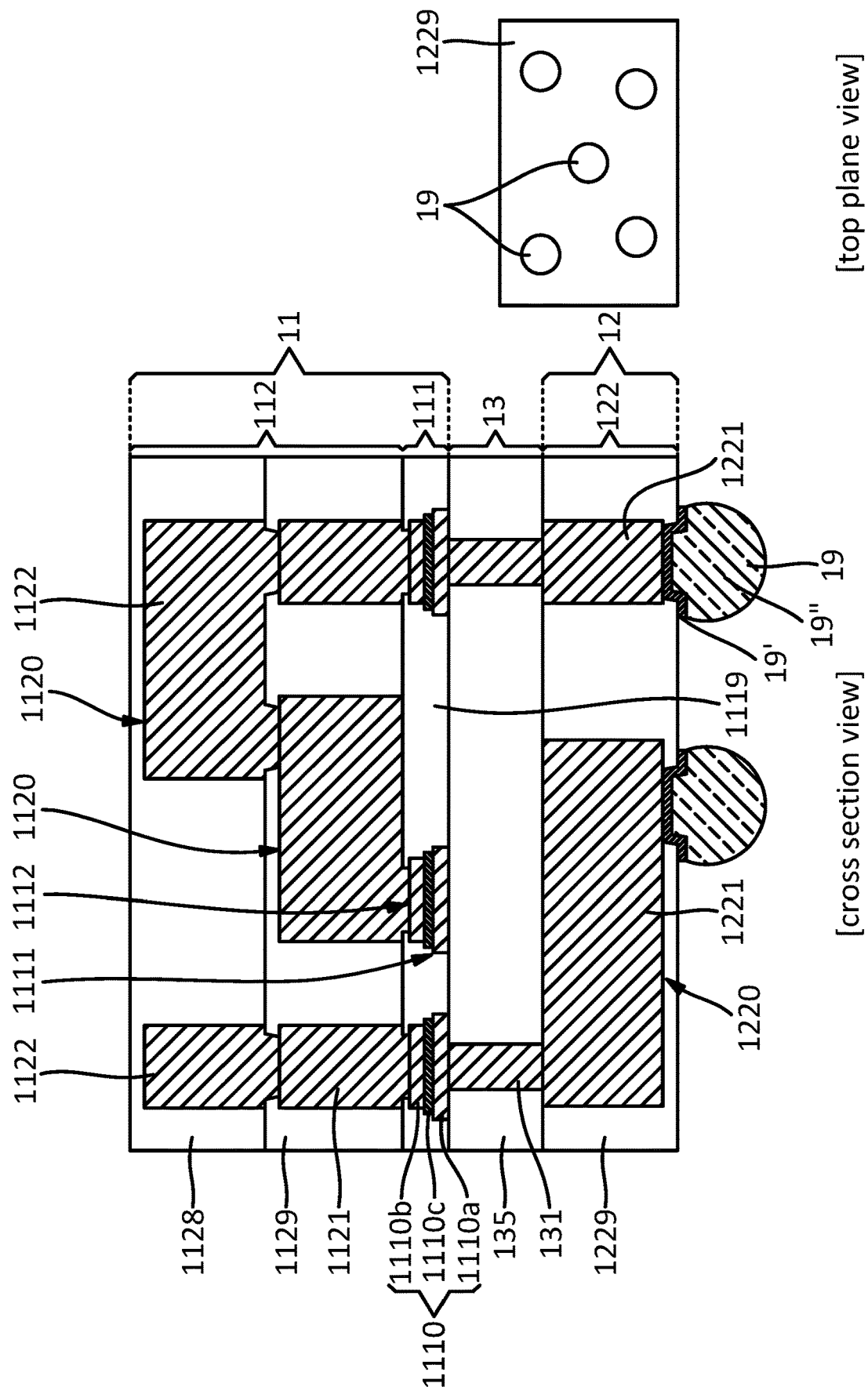

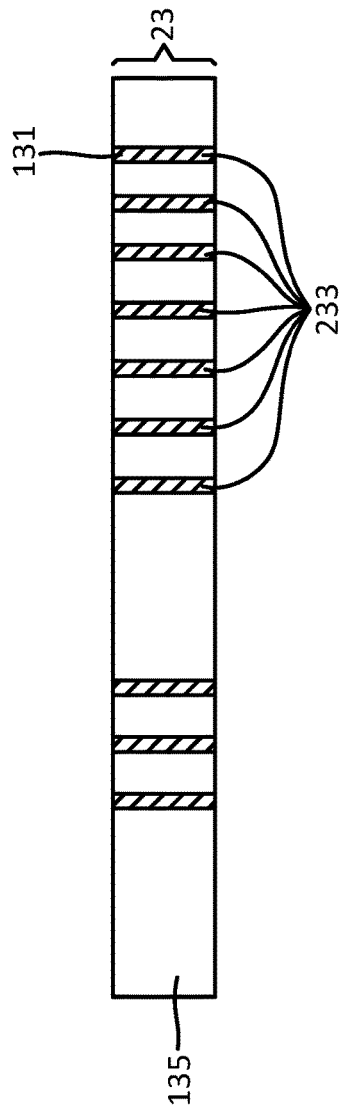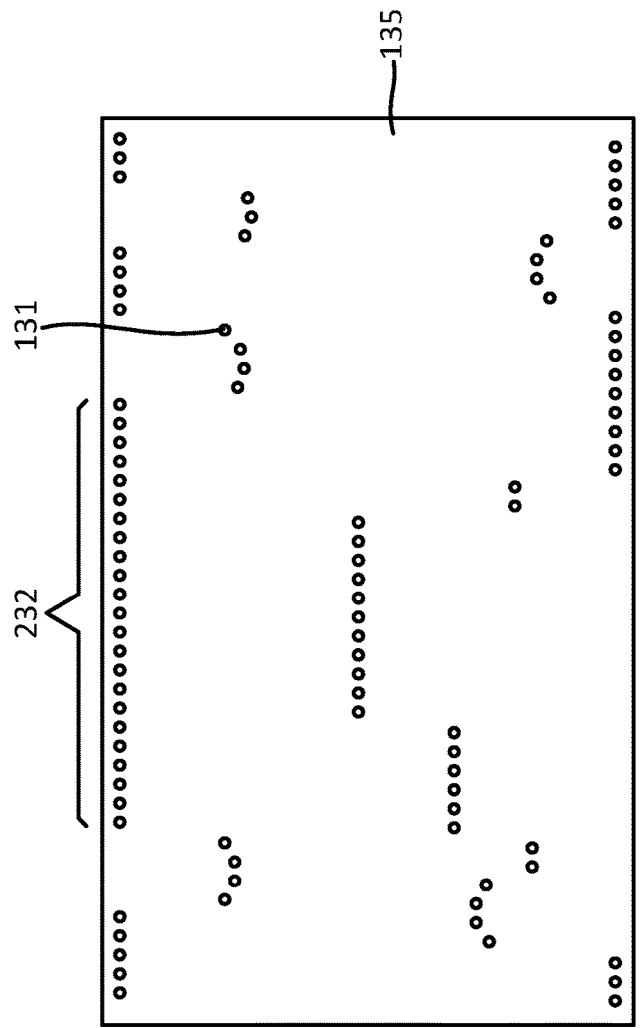

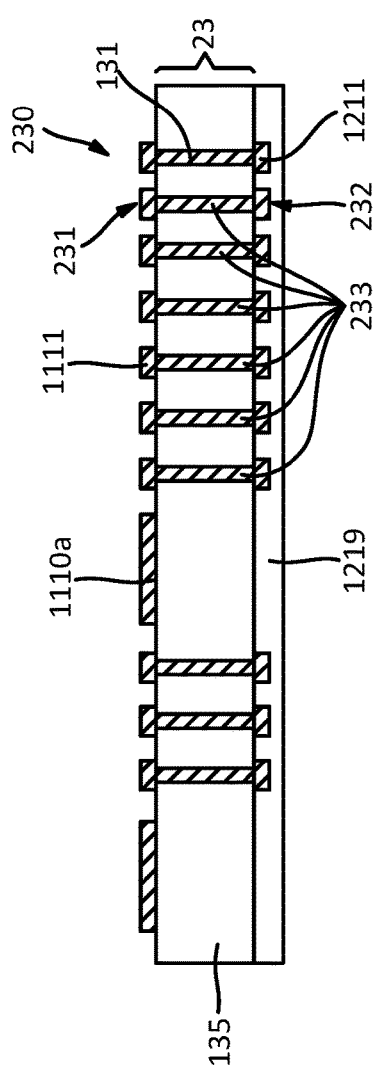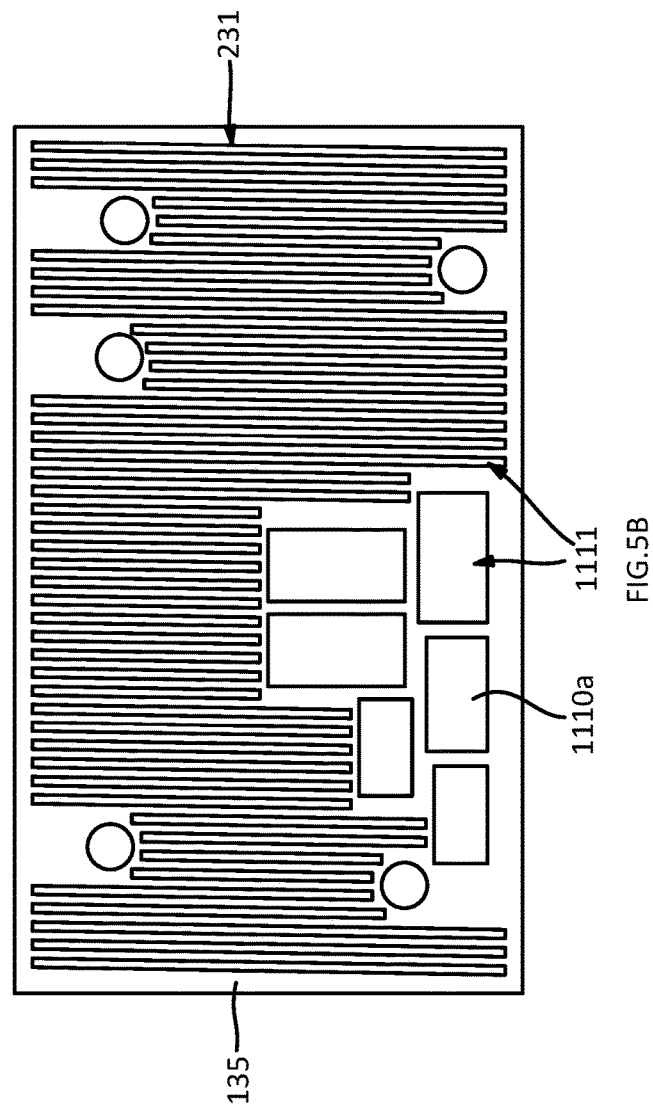

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 2A, 2B, 2C, 2D, 2E, 2F, 2G, 2H, 2I, 2J, 2K, 2L, and 2M show cross section or plane views of an example method for manufacturing an example electronic.

FIGS. 4A and 4B show cross section view and plane view of an example electronic device.

FIGS. 5A, 5B, 5C, and 5D show cross-sectional, plane, and perspective view of an example electronic device.

Figure 1:
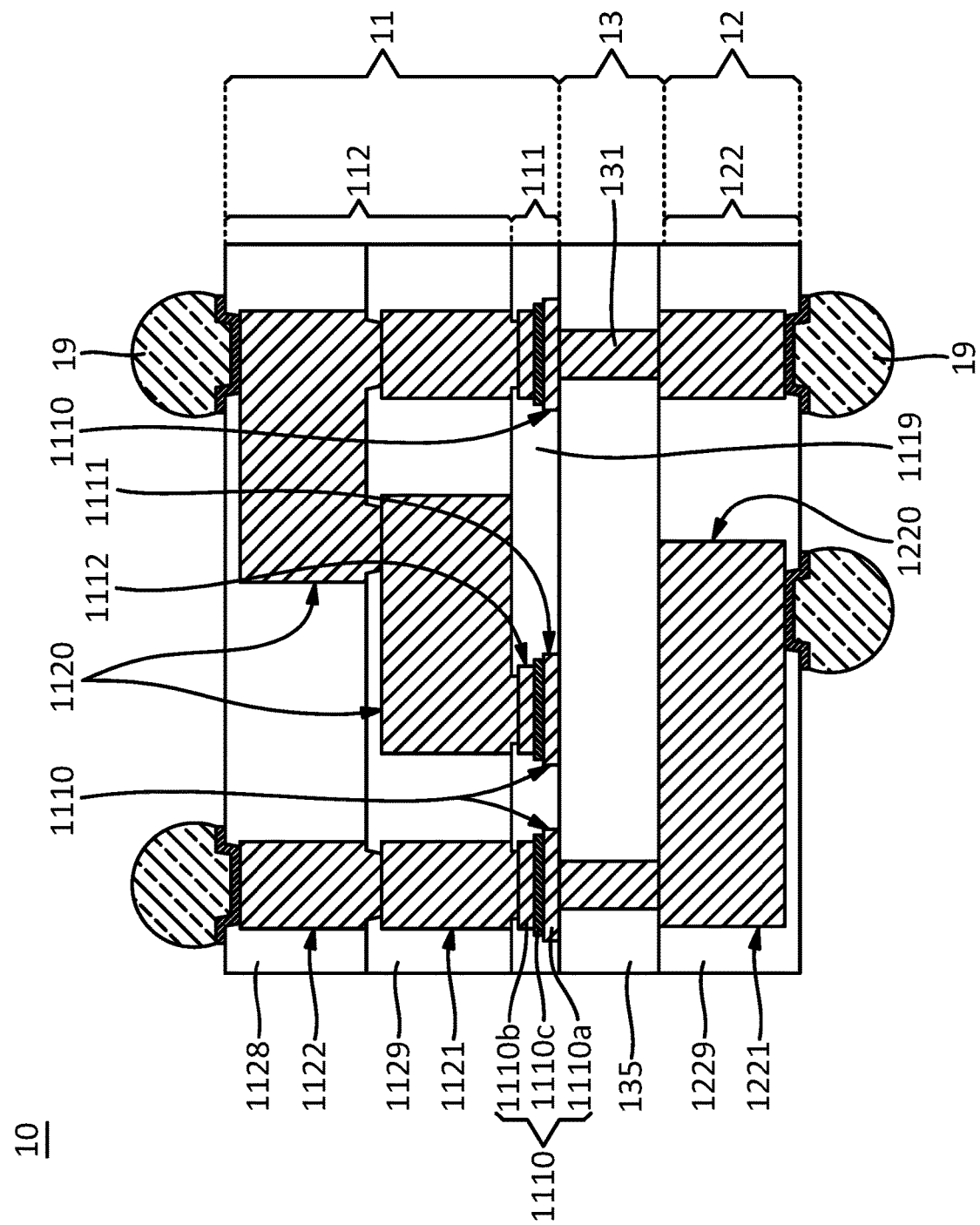
FIG. 1 shows a cross section view of an example electronic device.

The following discussion provides various examples of electronic devices and methods of manufacturing electronic devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," or "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In an example, an electronic device includes a substrate with a substrate front side, a substrate rear side opposite to the substrate front side, a substrate body, and conductive vias extending through the substrate body from the substrate front side to the substrate rear side. A first construct is over the substrate front side and includes a first dielectric structure and first conductors embedded in the first dielectric structure and coupled to the conductive vias. A second construct is over the substrate rear side and includes a second dielectric structure and second conductors embedded in the second dielectric structure and coupled to the conductive vias. One or more of the first conductors or the second conductors define one or more passive devices.

In an example, an electronic device includes a substrate having a substrate front side, a substrate rear side opposite to the substrate front side, a substrate body, and conductive vias extending through the substrate body from the substrate front side to the substrate rear side. An intermediate structure is over the substrate front side and includes an intermediate dielectric and intermediate conductors embedded in the intermediate dielectric, with a first intermediate conductor is-coupled to one of the conductive vias. A first passive structure is over the intermediate structure and includes a first dielectric and first conductors embedded in the first dielectric, with one of the first conductors coupled to one of the intermediate conductors. A second passive structure is over the substrate rear side and includes a second dielectric and second conductors embedded in the second dielectric, with one of the second conductors coupled to one of the conductive vias.

In an example, a method for forming an electronic device includes providing a substrate having a substrate front side, a substrate rear side opposite to the substrate front side, a substrate body, and conductive vias extending through the substrate body from the substrate front side to the substrate rear side. The method includes providing an intermediate structure over the substrate front side and including an intermediate dielectric and intermediate conductors embedded in the intermediate dielectric, with a first intermediate conductor coupled to one of the conductive vias. The method includes providing a first passive structure over the intermediate structure and including a first dielectric and first conductors embedded in the first dielectric, with one of the first conductors coupled to one of the intermediate conductors. The method includes providing a second passive structure over the substrate rear side and including a second dielectric and second conductors embedded in the second dielectric, with one of the second conductors coupled to one of the conductive vias.

Other examples are included in the present disclosure. Such examples may be found in the figures, in the claims, or in the description of the present disclosure.

FIG. 1 shows a cross section view of an example electronic device 10. In the example shown in FIG. 1, electronic device 10 can comprise substrate 13, first construct 11, second construct 12, and external interconnects 19, which can be optional. First construct 11 and second construct 12 can also be referred to as first element 11 and second element 12, first structure 11 and second structure 12, or first section 11 and second section 12 respectively.

Substrate 13 can comprise substrate body 135 and vias 131, which can also be referred to as conductive vias 131. First construct 11 can comprise intermediate structure 111 and passive structure 112. Intermediate structure 111 can comprise conductors 1111 and 1112, dielectric 1119, and capacitors 1110. Capacitors 1110 can comprise capacitor plates 1110a and 1110b and capacitor dielectric 1110c. Passive structure 112 can comprise inductors 1120, conductors 1121 and 1122, and dielectrics 1128 and 1129. Second construct 12 can comprise passive structure 122. Passive structure 122 can comprise inductors 1220, conductors 1221, and dielectric 1229.

In some examples, electronic device 10 can comprise or be referred to as an integrated passive device (IPD). In some examples, substrate 13 and dielectrics 1119, 1128, 1129, 1229 can be referred to as an electronic package and can provide protection for passive structures 112 and 122, and capacitors 1110 from external elements or environmental exposure. The electronic package can provide electrical coupling between external electrical components and external interconnects 19.

FIGS. 2A, 2B, 2C, 2D, 2E, 2F, 2G, 2H, 2I, 2J, 2K, 2L, and 2M show cross section or plane views of an example method for manufacturing electronic device 10.

FIG. 2A shows cross section and plane views of electronic device 10 at an early stage of manufacture. In the example shown in FIG. 2A, substrate 13 can be provided. In some examples, substrate 13 can comprise or be referred to as a base, a wafer, a panel, or a plate. In some examples, substrate 13 can comprise substrate body 135 and multiple vias 131. In some examples, substrate body 135 can comprise a substantially planar front side and a substantially planar rear side opposite to the front side. In some examples, substrate body 135 can comprise glass, ceramic, a wafer, such as a semiconductor wafer, a phenol resin or an epoxy resin. In some examples, vias 131 can comprise or be referred to as through glass vias (TGVs) or through vias (TVs). In some examples, vias 131 having a vertical length can be provided between the front and rear sides of substrate body 135. In some examples, vias 131 can be provided on regions needed to be connected to capacitors or inductors. In some examples, multiple openings can be provided on substrate body 135 by laser or a drill, a seed layer can be provided on surfaces of openings by an electroless plating process or a sputtering process, and a metal, such as copper (Cu), gold (Au), silver (Ag), nickel (Ni), palladium (Pd) or an alloy, can be sputtered on the seed layer, thereby completing conductive vias 131. In some examples, openings can be provided on substrate body 135, and a metal, such as copper, gold, silver, nickel, palladium or an alloy, can be sputtered thereto, thereby completing conductive vias 131. In some examples, vias 131 can be provided (that is, externally supplied by a manufacturer) while not being exposed through the front side or the rear side of substrate body 135, or vias 131 can be provided while being exposed through the front side or the rear side of substrate 13. In some examples, substrate body 135 can have a thickness in the range from approximately 0.28 millimeters (mm) to approximately 0.5 mm. In some examples, diameters of vias 131 can range from approximately 100 micrometers (μm) to approximately 50 μm. In some examples, vias 131 are embedded within substrate body 135 so that substrate body 135 covers at least sides of vias 131.

FIG. 2B shows a cross section and plane views of electronic device 10 at a later stage of manufacture. In the example shown in FIG. 2B, thickness of substrate 13 can be reduced using a thinning process, such as a grinding process or other processes as known to one of ordinary skill in the art. In some examples, grinding can be performed until vias 131 are exposed at the front side of substrate 13. As a result of grinding, the front side of vias 131 and the front side of substrate body 135 can be coplanar. In some examples, in a plane view, vias 131 can be regularly or irregularly arrayed on substrate body 135.

Figure 2C:
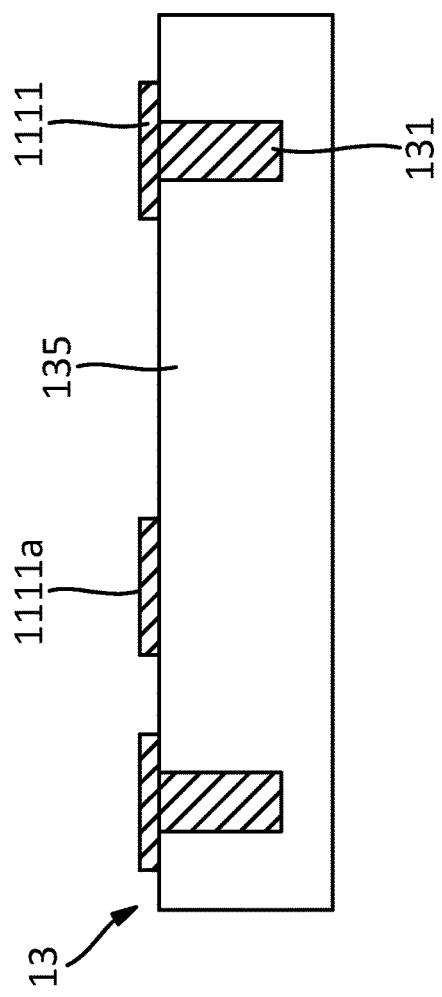

FIG. 2C shows a cross section view of electronic device 10 at a later stage of manufacture. In the example shown in FIG. 2C, conductors 1111 can be provided on substrate body 135. In some examples, conductors 1111 can be provided by a photolithography process and plating.

In some examples, a seed layer can be provided on substrate body 135. In some examples, the seed layer can be provided by electroless plating or sputtering. In some examples, the seed layer can comprise titanium (Ti), titanium tungsten (TiW), titanium/copper (Ti/Cu), titanium tungsten/copper (TiW/Cu), or nickel vanadium (NiV). In some examples, the seed layer can have a thickness in a range from approximately 0.1 μm (micrometer) to approximately 0.5 μm. Current can be supplied through the seed layer to plate-up conductors 1111.

Conductors 1111 can comprise or be referred to as one or more conductive layers or conductive patterns. In some examples, a metal, such as copper (Cu), gold (Au), silver (Ag), nickel (Ni), palladium (Pd) or an alloy, may be electroplated on the seed layer to form conductors 1111 providing on the seed layer. In some examples, the line/space/thickness of conductors 1111 may be about 2/2/2 μm to approximately 10/10/10 μm, respectively. In some examples, some regions of conductors 1111 provided on substrate body 135 can comprise or be referred to as capacitor plates. In other examples, evaporation, sputtering, chemical vapor deposition (CVD), or other deposition processes as known to one of ordinary skill in the art can be used.

In some examples, photoresist can be provided on conductors 1111. In some examples, the photoresist can be attached to or patterned on conductors 1111 in the form of a dry film or can be applied onto conductors 1111 in the form of a liquid through spin coating, spray coating, dip coating, or rod coating, followed by curing and patterning. In some examples, a mask having a pattern can be positioned on the photoresist, and UV (ultraviolet) rays can be irradiated into the mask, thereby transferring the pattern on the photoresist. In some examples, transferred portions or non-transferred portions in the photoresist are developed, thereby defining the pattern (e.g., openings) on the photoresist. The openings of the photoresist can be provided at regions of the photoresist corresponding to conductors 1111. In some examples, an etching process can be performed using the photoresist with openings as a mask, thereby etching some regions of conductors 1111 corresponding to the openings of the photoresist, and then removing. Some regions of conductors 1111 can be removed by, for example, chloric acid or nitric acid. As a result of etching, conductors 1111 directly or indirectly connected to vias 131 can be defined on substrate body 135. After the step of providing conductors 1111, the photoresist can be removed. In some examples, the photoresist can be stripped by acetone. The seed layer present at exterior sides of conductors 1111 can be etched and removed, with conductors 1111 remaining on substrate body 135. In some examples, some conductors 1111 can be defined or used as capacitor plates 1110a. Conductors 1111 or capacitor plate 1110a can have a thickness in the range from approximately 2 μm to approximately 5 μm.

Figure 2D:
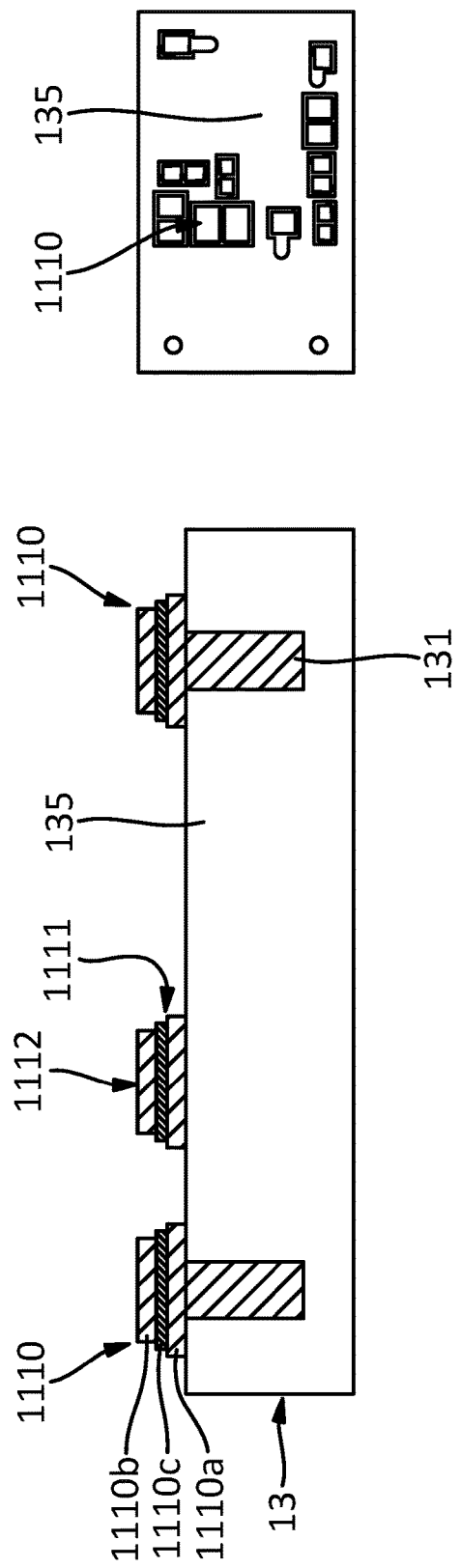

FIG. 2D shows a cross section view of electronic device 10 at a later stage of manufacture. In the example shown in FIG. 2D, capacitors 1110 can be provided on substrate 13. In some examples, capacitors 1110 can be completed by providing capacitor dielectric 1110c on capacitor plate 1111a and then providing capacitor plate 1111b on capacitor dielectric 1110c. Widths of, or distances between, corresponding capacitor plates 1111a and 1111b can be defined according to desired capacitances for capacitors 1110.

Capacitor dielectric 1110c can be provided on capacitor plate 1110a. Capacitor dielectric 1110c can be referred to as an insulator. In some examples, capacitor dielectric 1110c can comprise silicon nitride (SiN, $Si_3N_4$), silicon oxide ($SiO_2$), or silicon oxide nitride (SiON). In some examples, capacitor dielectric 1110c can be provided by a photolithography process and an etching process. In some examples, capacitor dielectric 1110c can be provided on capacitor plate 1110a and the front side of substrate body 135 by atmospheric pressure chemical vapor deposition (APCVD), low pressure chemical vapor deposition (LPCVD) or plasma enhanced chemical vapor deposition (PECVD). Photoresist can be provided on capacitor dielectric 1110c, a mask having a pattern can be positioned on the photoresist, and UV rays can be irradiated into the mask, thereby transferring the pattern on the photoresist. In some examples, a region of the photoresist can be developed, and thus the pattern (e.g., openings) can be provided on the photoresist. In some examples, the openings of the photoresist can be provided at some regions of the photoresist, corresponding to regions of capacitor dielectric 1110c, etched for removal. In some examples, an etching process can be performed using the photoresist with openings as a mask, thereby etching some regions of capacitor dielectric 1110c, corresponding to the openings of the photoresist, and then removing. As a result of this process, capacitor dielectric 1110c can be defined on regions of the photoresist corresponding to capacitor plates 1110a. After the step of providing capacitor dielectric 1110c, the photoresist can be removed. In some examples, capacitor dielectric 1110c can have a thickness in the range from approximately 0.1 μm to approximately 0.5 μm. In some examples, one or more conductors 1111 can be provided devoid of capacitor dielectric 1110c to provide an interconnect structure with one or more conductors 1112.

Subsequently, capacitor plate 1110b can be provided on capacitor dielectric 1110c. In some examples, conductor 1112 and capacitor plates 1110b can be provided on capacitor dielectric 1110c and the front side of substrate body 135 by similar formation or materials as described with respect to conductor 1111 and capacitor plates 1110a. In some examples, conductor 1112 or capacitor plate 1110b can have a thickness in the range from approximately 2 μm to approximately 5 μm. Accordingly, multiple capacitors 1110 can be provided on the front side of substrate body 135.

FIG. 2E shows a cross section view of electronic device 10 at a later stage of manufacture. In the example shown in FIG. 2E, dielectric 1119 can be provided on the front side of substrate body 135. Dielectric 1119 can cover lateral sides of capacitors 1110. In some examples, dielectric 1119 can surround capacitor plates 1110a and 1110b, and capacitor dielectric 1110c. Front sides of capacitor plates 1110b can be exposed from dielectric 1119. In some examples, openings can be provided at regions of dielectric 1119 corresponding to capacitor plates 1110b. Dielectric 1119 can comprise or be referred to as one or more dielectric layers. In some examples, dielectric 1119 can comprise a photo-definable organic dielectric material, such as polyimide (PI), benzocyclobutene (BCB) or polybenzooxazole (PBO). In some examples, the dielectric material can be coated in the form of a liquid. Such a photo-definable dielectric material, employed for appropriately providing a desired photo-defined shape, can be a filler-free material capable of obviating a need of a structural reinforcer such as inorganic particles, strands, weaving pattern, or other particles capable of distracting light during photo-patterning process. In some examples, the filler-free feature of the filler-free dielectric material can permit a reduction in the thickness of dielectric. Although the photo-definable dielectric material may be an organic material, in some other example, the dielectric material can comprise one or more inorganic dielectric materials. Some examples of the inorganic dielectric layer can comprise silicon nitride ($Si_3N_4$), silicon oxide (e.g., $SiO_2$), or silicon oxide nitride (SiON). The inorganic dielectric layer can be provided by using oxidation or nitridation, instead of using a photo-defined organic dielectric material. The inorganic dielectric layer can be a filler-free material without strands, weaving patterns or other dissimilar inorganic particles. In some examples, a planarization process can be used to smooth and flatten the front side of dielectric 1119. In some examples, a chemical mechanical planarization (CMP) can be used.

In some examples, the dielectric providing step can be followed by an etching step. In some examples, photoresist can be provided on dielectric 1119, and openings can be provided to a region of photoresist corresponding to capacitor plate 1110b by a photolithography process. An etching solution can be provided to the openings of the photoresist, thereby etching a region of dielectric 1119 corresponding to capacitor plate 1110b, and thus providing the openings to a region of dielectric 1119, corresponding to capacitor plate 1110b. Thereafter, the photoresist can be removed. In some examples, dielectric 1119 can have a thickness in a range from approximately 5 μm to approximately 10 μm. In some examples, conductors 1111 and 1112, dielectric 1119, and capacitors 1110 can be collectively referred to or defined as intermediate structure 111 or capacitor structure 111.

FIG. 2F shows cross section and plane views of electronic device 10 at a later stage of manufacture. In the example shown in FIG. 2F, conductors 1121 can be provided on intermediate structure 111. Conductors 1121 can be coupled to capacitors 1110, such as coupled to capacitor plates 1110b. As illustrated in the plane view, conductors 1121 can define inductors 1120 extending over dielectric 1119 from conductors 1112 or capacitor plates 1110b, or can define pillars (or vias) positioned on conductors 1112 or capacitor plates 1110b. In some examples, inductors 1120 can comprise or be referred to as a variety of two-dimensional types of inductors, such as spiral type inductors, meander type inductors, or single roof type inductors. When performing a function as inductors 1120, conductors 1121 can have an appropriate thickness, length, or pattern so as to have a desired inductance value. In some examples, the formation or materials of conductors 1121 can be similar to those described with respect to conductors 1111 or 1112. In some examples, conductors 1121 or inductors 1120 can have a thickness in the range from approximately 10 μm to approximately 20 μm.

FIG. 2G shows a cross section view of electronic device 10 at a later stage of manufacture. In the example shown in FIG. 2G, dielectric 1129 covering conductors 1121 can be provided. Dielectric 1129 can cover lateral sides of conductors 1121, and a front side of dielectric 1119. Front sides of conductors 1121 can be exposed from dielectric 1129. In some examples, openings can be provided at regions of dielectric 1129 corresponding to conductors 1121. Dielectric 1129 can comprise or be referred to as one or more dielectric layers. In some examples, dielectric 1129 can be provided by similar formation nor materials as described with respect to dielectric 1119. Conductors 1121 can have a larger thickness or height than conductors 1111, 1112 or capacitors 1110, and dielectric 1129 can also have a larger thickness or height than dielectric 1119. In some examples, dielectric 1129 can have a thickness in the range from approximately 10 μm to approximately 20 μm.

FIG. 2H shows a cross section view of electronic device 10 at a later stage of manufacture. In the example shown in FIG. 2H, conductors 1122 can be provided on dielectric 1129. Conductors 1122 can be coupled to conductors 1121, or can extend over dielectric 1129. In a plane view, conductors 1122 can define inductors 1120, or can define distinct pillars, vias, or paths. In some examples, the formation or materials of conductors 1122 can be similar to those described with respect to conductors 1121.

Figure 2I:
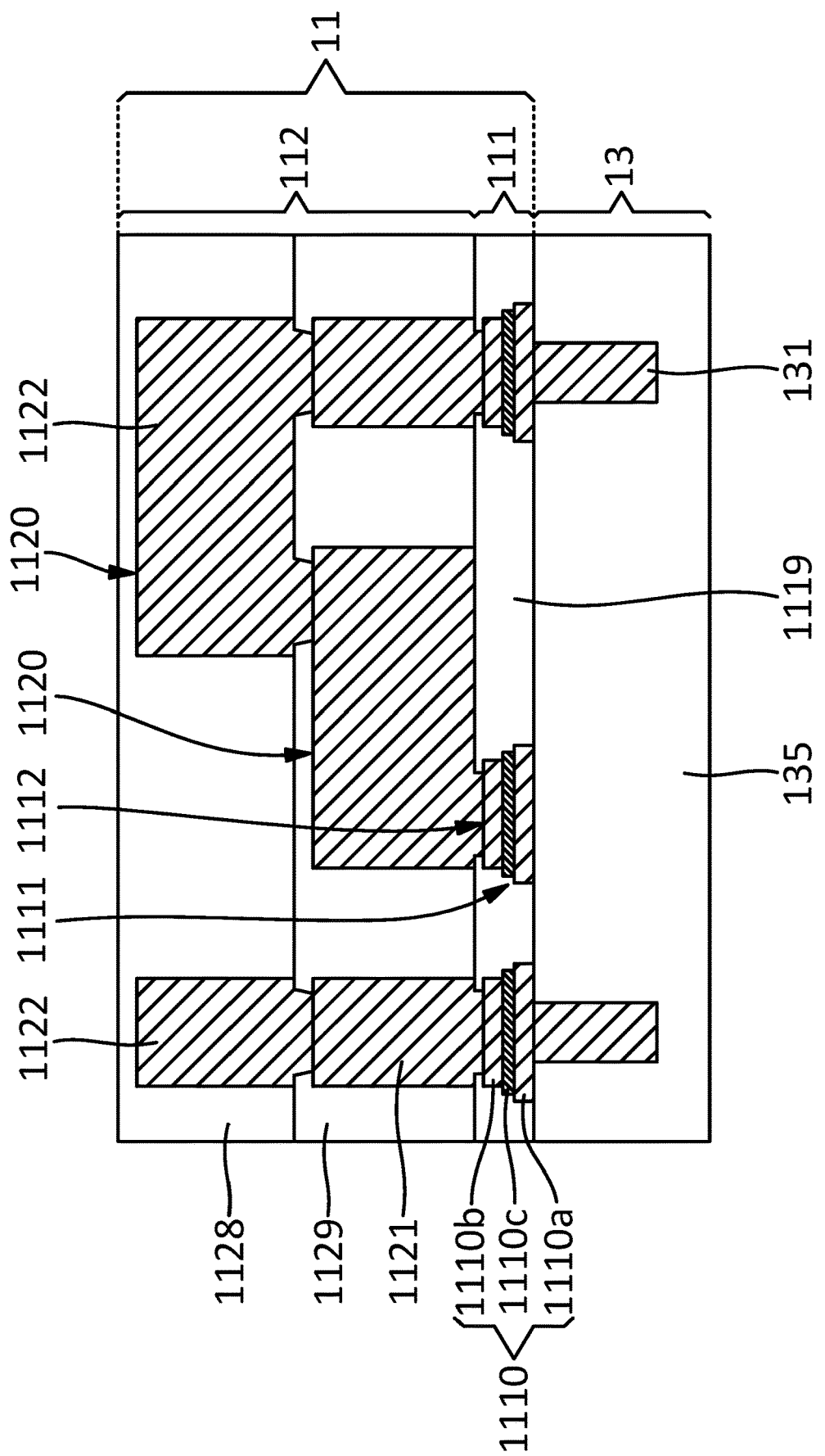

FIG. 2I shows a cross section view of electronic device 10 at a later stage of manufacture. In the example shown in FIG. 2I, dielectric 1128 covering conductors 1122 can be provided. Dielectric 1128 can cover side portions of conductors 1122 and a front side of dielectric 1128. In some examples, the formation or materials of dielectric 1128 can be similar to those described with respect to dielectric 1129. In some examples, dielectric 1128 can comprise openings exposing front portions of conductors 1122, such as to couple one or more external interconnects 19 to such exposed portions of conductors 1122 as seen in FIG. 1. In some examples, conductors 1121 and 1122, dielectrics 1129 and 1128, and inductors 1120 can be collectively referred to or defined as passive structure 112. Intermediate structure 111 and passive structure 112 can be collectively referred to or defined as first construct 11.

Figure 2J:
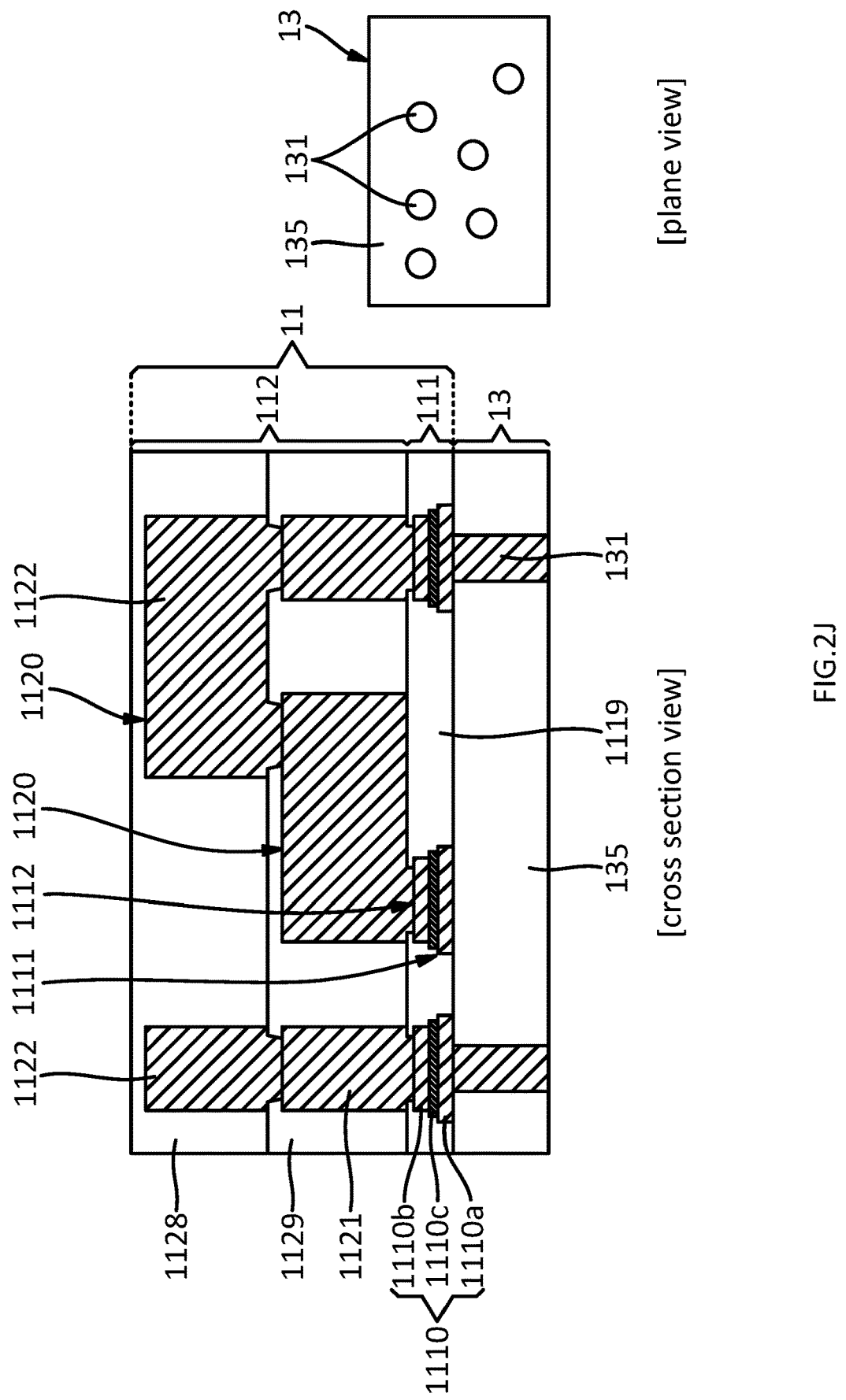

FIG. 2J shows a cross section and plane views of electronic device 10 at a later stage of manufacture. In the example shown in FIG. 2J, the thickness of substrate 13 can be further reduced. In some examples, grinding can be performed until vias 131 are exposed at the rear side of substrate 13. As a result of grinding, the rear side of vias 131 and the rear side of substrate body 135 can be coplanar. In some examples, in a plane view, vias 131 can be regularly or irregularly arrayed on substrate body 135.

Figure 2K:
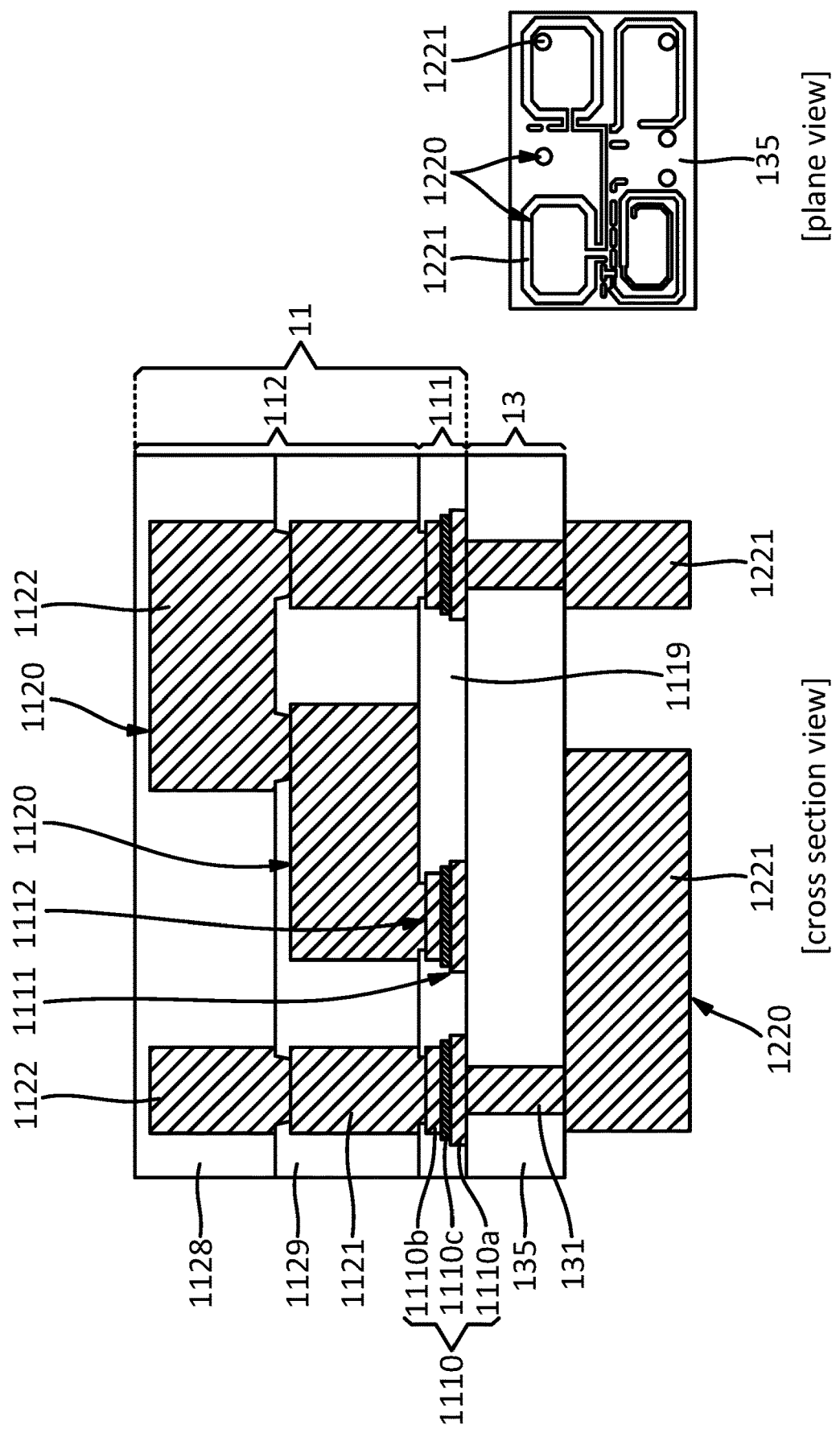

FIG. 2K shows a cross section and plane views of electronic device 10 at a later stage of manufacture. In the example shown in FIG. 2K, multiple conductors 1221 can be provided on the rear side of substrate body 135. In some examples, the formation or materials of conductors 1221 can be similar to those described with respect to conductors 1121. Conductors 1221 can define inductors 1220, or can define distinct pillars, vias, or paths. In some examples, inductors 1220 can comprise or be referred to as a variety of two-dimensional types of inductors, such as spiral type inductors, meander type inductors, or single roof type inductors. When performing a function as inductors 1120, conductors 1121 can have an appropriate thickness and length so as to have a desired inductance value. In some examples, conductors 1221 can have a thickness in the range from approximately 10 μm to approximately 20 μm.

Figure 2L:
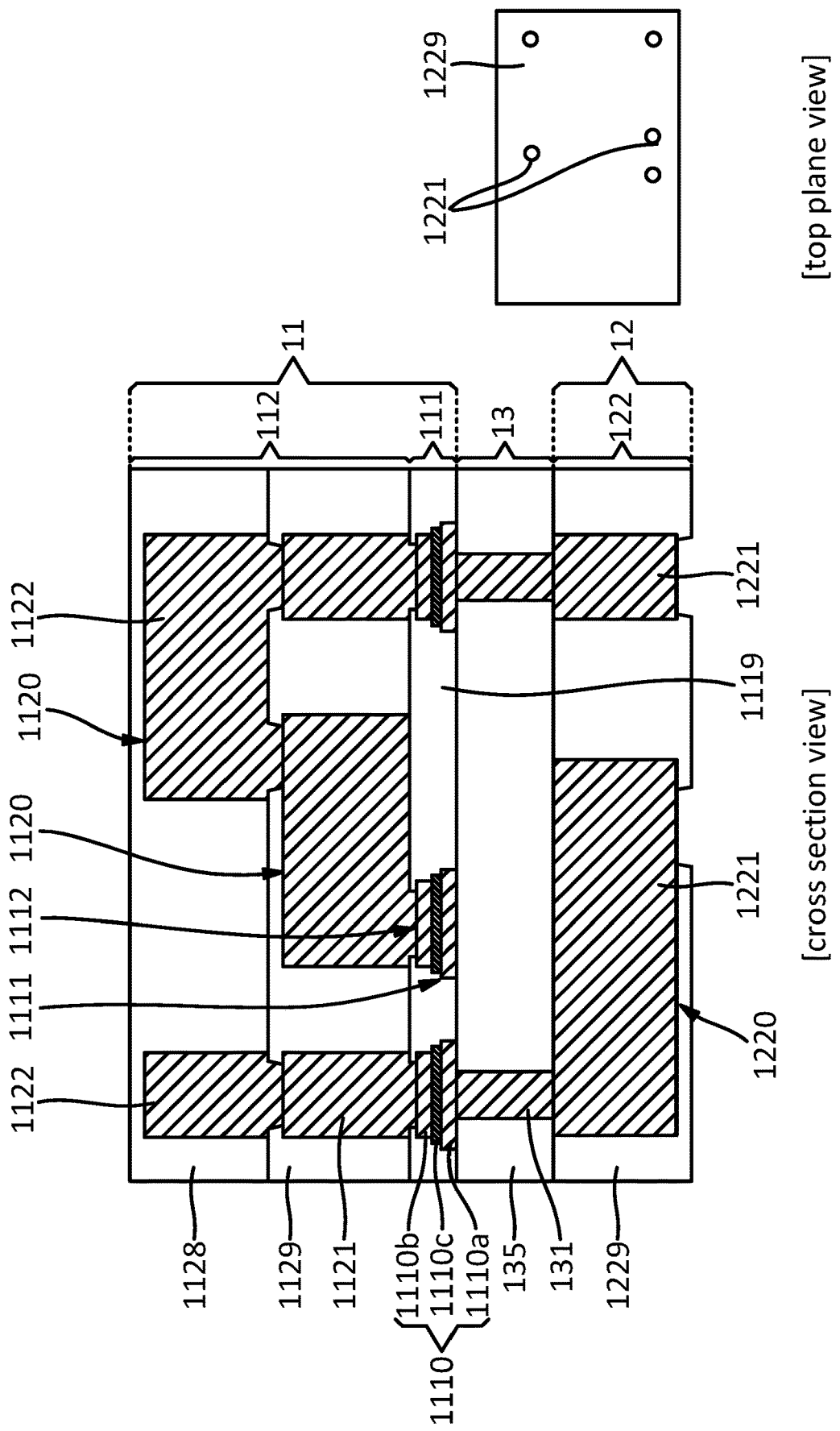

FIG. 2L shows a cross section and plane views of electronic device 10 at a later stage of manufacture. In the example shown in FIG. 2L, dielectric 1229 can be provided on the rear side of substrate body 135. Dielectric 1229 can cover lateral sides or rear sides of conductors 1221. In some examples, dielectric 1229 can comprise openings at some regions corresponding to conductors 1221. Rear sides of conductors 1221 can be exposed from dielectric 1229. In a plane view, openings can be regularly or irregularly arrayed. In some examples, the formation or materials of dielectric 1229 can be similar to those described with respect to dielectric 1129. In some examples, dielectric 1229 can have a thickness in the range from approximately 10 μm to approximately 20 μm. In some examples, conductors 1221, dielectric 1229 and inductors 1220 can be collectively referred to or defined as passive structure 122 or as second construct 12. Although a single layer of passive structure 122 is shown in FIG. 2L, two or more layers of passive structures 122 can be provided, such as described with respect to passive structure 112.

As described, in electronic device 10, first construct 11 can be provided on the front side of substrate 13, and second construct 12 can be provided on the rear side of substrate 13. In some examples, first construct 11 can comprise intermediate structure 111 including capacitors 1110, or passive structure 112 including inductors 1120. Second construct 12 can comprise passive structure 122 including inductors 1220.

FIG. 2M shows a cross section and plane view of electronic device 10 at a later stage of manufacture. In the example shown in FIG. 2M, external interconnects 19 can be provided. In some examples, UBM 19' (under-bump metallization) can be optionally provided on portions of conductors 1221 exposed from dielectric 1229. In some examples, UBM 19' can be considered part of external interconnects 19. In some examples, the formation or materials of UBM 19' can be similar to those described with respect to conductors 1111. UBM 19' can comprise one or more metal layers such as copper, gold, silver, nickel, palladium, or an alloy. In some examples, UBM 19' can have a thickness in the range from approximately 2 μm to approximately 5 μm.

In some examples, external interconnects 19 can comprise or be referred to as conductive balls, conductive bumps, conductive pillars, or solder balls, which can be coupled directly to conductors 1221 or through UBM 19'. In some examples, flux can be provided on conductors 1221 or UBM 19', solder balls can be dropped on the flux, and the solder balls can then be coupled to conductors 1221 or UBM 19' through a reflow process or a laser assist bonding (LAB) process. In some examples, external interconnect 19 can comprise tin (Sn), silver (Ag), lead (Pb), copper (Cu), Sn—Pb, $Sn_{37}$—Pb, $Sn_{95}$—Pb, Sn—Pb—Ag, Sn—Cu, Sn—Ag, Sn—Au, Sn—Bi, or Sn—Ag—Cu. In some examples, external interconnects 19 can have a thickness or width in the range from approximately 50 μm to approximately 150 μm.

Electronic device 10 can be finalized having better flatness or planarity throughout its different layers or structures. When conductors and dielectrics are repeatedly provided or stacked on the front side of substrate 13, flatness can be noticeably reduced as more layers are stacked. In the present disclosure, the layers of conductors and the dielectrics can be provided not only to the front side of substrate 13 but also to the rear side of substrate 13, thereby yielding electronic device layers or structures having better planarity. In some examples, the electronic device according to the present disclosure can provide improved or desired inductor performance by providing an inductor not only to the front side of substrate 13 but also to the rear side of substrate 13.

Figure 3:
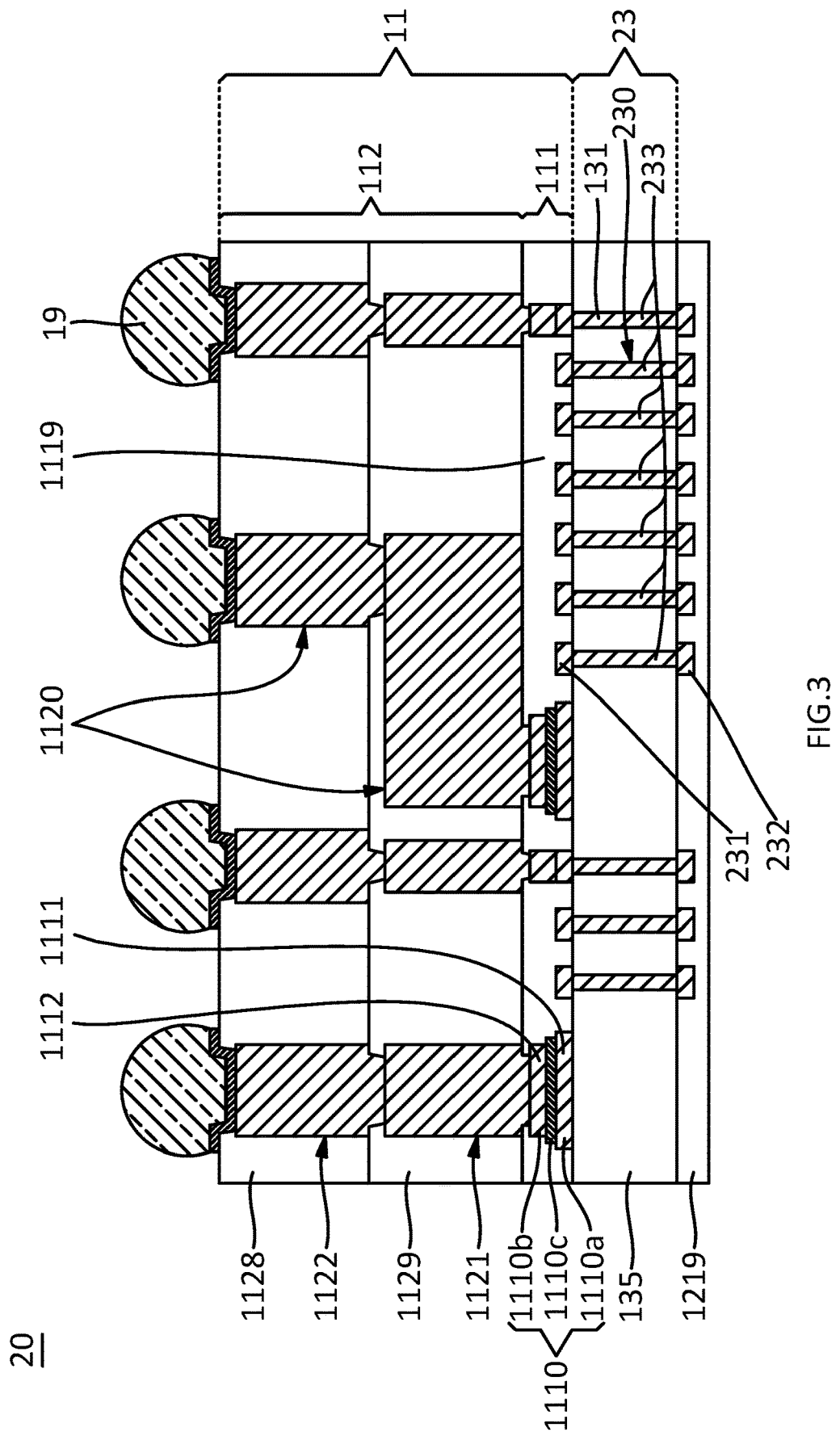
FIG. 3 shows a cross section view of an example electronic device.
Figure 5D:
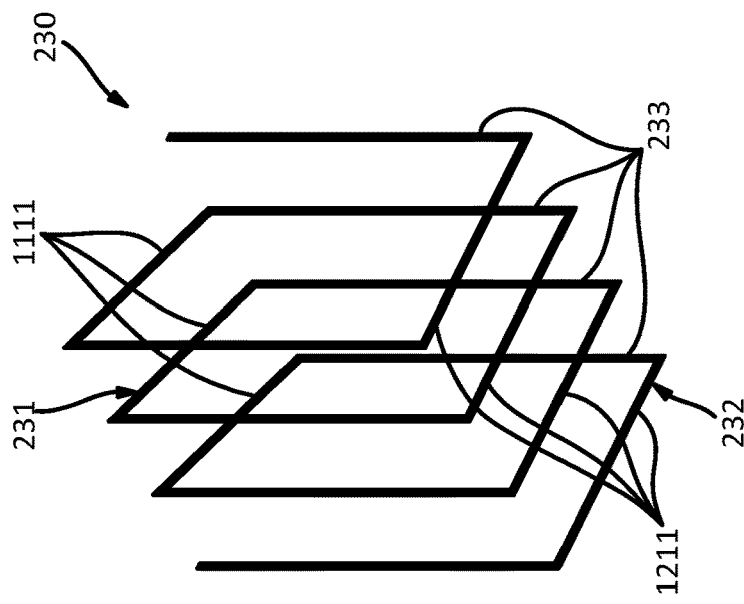
Figure 5C:
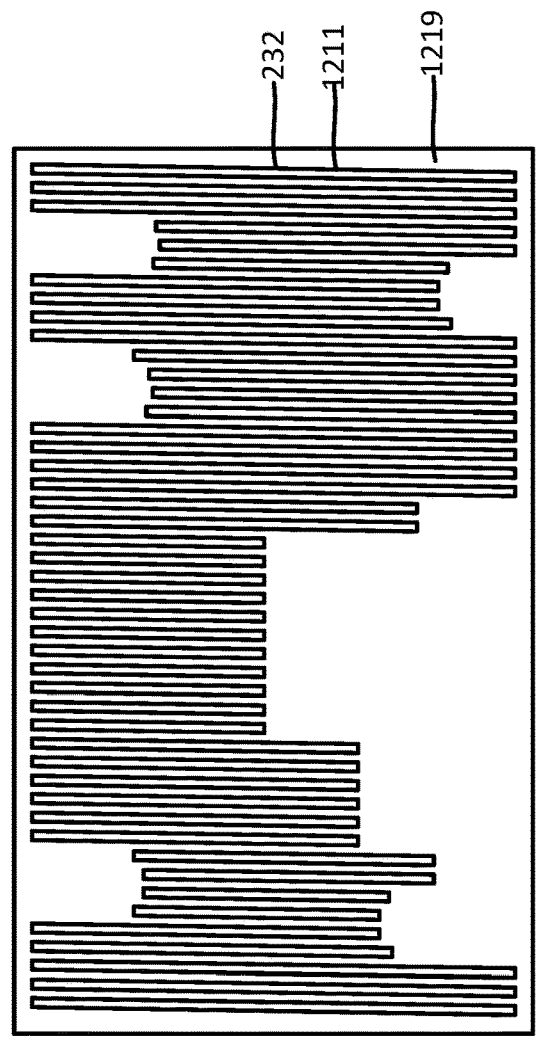

FIG. 3 shows a cross section view of an example electronic device 20. Portions of electronic device 20 can be similar to corresponding portions of electronic device 10 in terms of formation, structures, or materials. In the example shown in FIG. 3, electronic device 20 can comprise substrate 23, first construct 11, and external interconnects 19. Substrate 23 can comprise substrate body 135, vias 131, and a passive element such as inductor 230. Inductor 230 can comprise inductor patterns 231 and 232 and inductor vias 233. Electronic device 20 shown in FIG. 3 can be similar to electronic device 10 described through FIGS. 1 and 2A-2M, and can comprise substrate 23 with inductor 230 (for example, a coil inductor).

FIGS. 4A and 4B show cross section view and plane view of a portion of electronic device 20. In the example shown in FIGS. 4A and 4B, substrate 23 comprising substrate body 135, vias 131, and multiple inductor vias 233, can be provided. Substrate 23 can be similar to substrate 13 in terms of formation, structures, or materials, and comprises inductor vias 233. Vias 131 and inductor vias 233 can penetrate through substrate body 135. In some examples, the front side of vias 131 and inductor vias 233 and the front side of substrate body 135 can be coplanar, or the rear side of vias 131 and inductor vias 233 and the rear side of substrate body 135 can be coplanar. In some examples, in plane view, vias 131 and inductor vias 233 can be regularly or irregularly arrayed on substrate body 135. In some examples, inductor vias 233 can be initially decoupled from each other. The line/space/thickness of each of inductor vias 233 may be about 50/100/150 μm to approximately 100/150/500 μm, respectively, but the dimensions of inductor vias 233, or the separation between inductor vias 233, can be varied to achieve a desired inductance value.

FIGS. 5A, 5B, 5C, and 5D show cross-sectional, plane, and perspective view of an example electronic device. In the example shown in FIGS. 5A to 5C, comprising conductors 1111 and 1211 can be provided on substrate 23 to couple multiple inductor vias 233 together and define respective inductor paths. In some examples, multiple conductors 1111 coupling multiple inductor vias 233 can be provided on the front side of substrate body 135, where conductors 1111 can comprise or be referred to as inductor patterns or inductor traces 231. In some examples, conductors 1111 can also define portions of capacitors 1110, such as capacitor plates 1110a. In some examples, conductors 1111 can be coupled to or electrically disconnected from vias 131 that penetrate substrate body 135. In some examples, multiple conductors 1211 coupling multiple inductor vias 233 can be provided on the rear side of substrate body 135, where conductors 1211 can comprise or be referred to as inductor patterns or inductor traces 232. In some examples, dielectric 1219 can be provided on the rear side of substrate body 135, covering or protecting the conductors 1121 on the rear side of substrate body 135.

Inductors 230 can substantially provide coil inductors by including multiple inductor vias 233 and multiple inductor patterns 231 and 232 coupled together in an inductor path. In general, inductance of coil inductors 230 can be determined by the mathematical formula below:

$$L_{coil} \approx N^2 \mu_0 \mu_r \left(\frac{D}{2}\right)\left[\ln\left(\frac{8D}{d}\right) - 2\right]$$

where N is the number of turns of coils, $\mu_0$ is permeability of vacuum, $\mu_r$ is relative permeability, D is a diameter of coil, and d is a thickness of coil. Eventually, since $\mu_0$ and $\mu_r$ are fixed constants, the inductance of coil inductors 230 can be determined by the diameter D and thickness d of coil. In some examples, in coil inductors 230 composed of inductor vias 233 and inductor patterns 231 and 232, the diameter D and thickness d of coil can be determined, thereby determining a desired inductance value.

Figure 6:
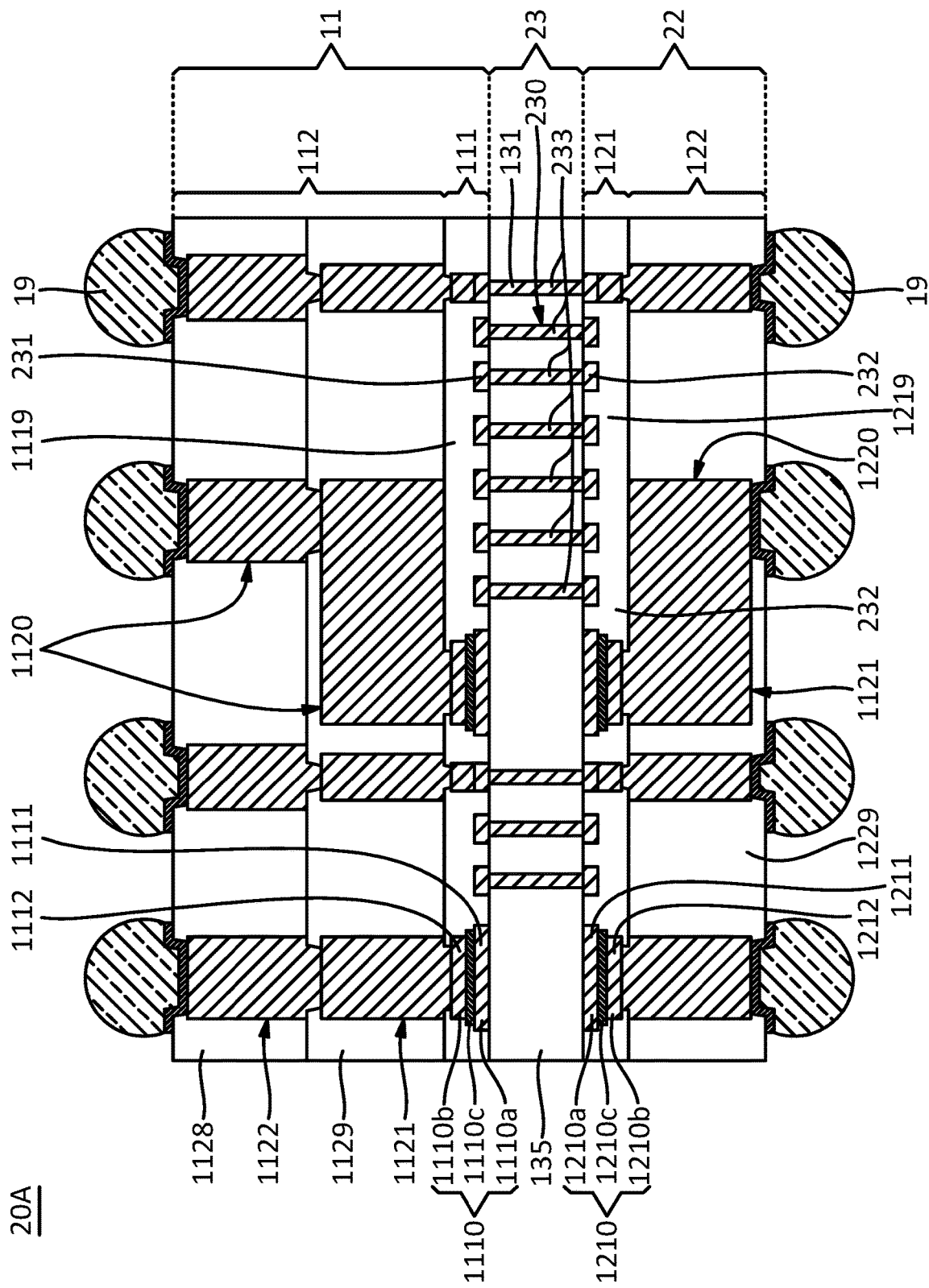
FIG. 6 shows a cross section view of an example electronic device.

FIG. 6 shows a cross section view of an example electronic device 20A. Electronic device 20A shown in FIG. 6 can be similar to electronic device 10 shown in FIG. 1 and electronic device 20 shown in FIG. 3. In the example shown in FIG. 6, electronic device 20A can comprise substrate 23, first construct 11, second construct 22, and external interconnects 19.

Portions of electronic device 20A can be similar to corresponding portions described for electronic device 10 or 20 in terms of formation, structures, or materials. For example, substrate 23 shown in FIG. 6 can correspond to substrate 23 shown in FIG. 3, and first construct 11 and second construct 22 shown in FIG. 6 can correspond to first construct 11 and second construct 12 shown in FIG. 1.

In the present example, second construct 22 can be similar to second construct 12 (FIGS. 1 and 2A-2M) comprising passive structure 122, and also comprises intermediate structure 121. Intermediate structure 121 can be similar to intermediate structure 111 in terms of formation, structures, or materials. Intermediate structure 121 can permit the addition of capacitors 1210 at the back side of substrate 23. Intermediate structure 121 can comprise conductors 1211 and 1212, dielectric 1219, and capacitors 1210 defined by capacitor plates 1210a and 1210b, and by capacitor dielectric 1210c.

It is understood that the different examples illustrated herein or portions thereof can be combined with other examples illustrated herein as well as other examples. As used herein, passive structures or passive devices can include inductor devices, capacitor devices, resistor devices, or combinations thereof.

In the foregoing descriptions and drawings, for a better understanding of the present disclosure, various components (for example, vias, conductors, dielectric, capacitor plate, capacitor dielectric, inductor patterns, etc.) have been described or shown in substantially rectangular or square cross-sectional forms. However, it will be appreciated by those skilled in the art that these components in a practical electronic device may have streamlined cross sections, round cross sections or trapezoidal cross sections due to many limitations in the manufacturing process (for example, resolution of a UV exposure apparatus, material characteristics of photoresist, etching characteristics of conductor materials, etching characteristics of dielectric materials, etc.). Moreover, in the foregoing descriptions and drawings, various components have been described to have horizontal or vertical surfaces shaped of flat straight lines will be appreciated by those skilled in the art that the horizontal or vertical surfaces may not be shaped of flat straight line shapes but may be, for example, serpentine horizontal or vertical planes, due to many limitations in the manufacturing process, as described above.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:
a substrate comprising:
a substrate front side;
a substrate rear side opposite to the substrate front side;
a substrate body; and
conductive vias extending through the substrate body from the substrate front side to the substrate rear side;
a first construct over the substrate front side, comprising:
a first dielectric structure; and
first conductors embedded in the first dielectric structure and coupled to the conductive vias; and
a second construct over the substrate rear side, comprising:
a second dielectric structure; and
second conductors embedded in the second dielectric structure and coupled to the conductive vias, wherein:
the substrate is interposed between the first construct and the second construct;
the first conductors define a first passive device embedded in the first dielectric structure; and
the second conductors define a second passive device embedded in the second dielectric structure.

2. The electronic device of claim 1, wherein:
the first dielectric structure comprises an intermediate dielectric and a first dielectric; and
the first construct comprises:
an intermediate structure adjacent to the substrate front side, comprising:
the intermediate dielectric; and
an intermediate passive device embedded in the intermediate dielectric, the intermediate passive device coupled to the conductive vias;
the first passive device is embedded in the first dielectric; and
the first passive device is coupled to the intermediate passive device.

3. The electronic device of claim 2, wherein:
the first passive device comprises an inductor device.

4. The electronic device of claim 2, wherein:
the intermediate passive device comprises a capacitor device.

5. The electronic device of claim 1, wherein:
the first conductors define a capacitor device.

6. The electronic device of claim 5, wherein:
the capacitor device comprise:
a first capacitor plate defined by a first intermediate conductor of the first conductors, and coupled to at least one of the conductive vias;
a capacitor dielectric over the first capacitor plate; and
second capacitor plate defined by a second intermediate conductor of the first conductors over the capacitor dielectric.

7. The electronic device of claim 1, wherein:
the conductive vias comprise inductor vias; and
one or more of the first conductors or the second conductors include inductor patterns coupled to the inductor vias.

8. The electronic device of claim 1, wherein:
rear sides of the conductive vias are coplanar with the substrate rear side.

9. The electronic device of claim 1, further comprising:
external interconnects coupled to one or more of the first construct or the second construct.

10. An electronic device, comprising:
a substrate comprising:
a substrate front side;
a substrate rear side opposite to the substrate front side;
a substrate body; and
conductive vias extending through the substrate body from the substrate front side to the substrate rear side;
an intermediate structure over the substrate front side, comprising:
an intermediate dielectric; and
intermediate conductors embedded in the intermediate dielectric, with a first intermediate conductor coupled to one of the conductive vias;
a first passive structure over the intermediate structure, comprising:
a first dielectric; and
first conductors embedded in the first dielectric, with one of the first conductors coupled to one of the intermediate conductors; and
a second passive structure over the substrate rear side, comprising:
a second dielectric; and
second conductors embedded in the second dielectric, with one of the second conductors coupled to one of the conductive vias.

11. The electronic device of claim 10, wherein:
the intermediate conductors in the intermediate structure define a capacitor device.

12. The electronic device of claim 10, wherein:
the second conductors define a capacitor device.

13. The electronic device of claim 10, wherein:
the second conductors define an inductor device.

14. The electronic device of claim 10, wherein:
the substrate is configured as a third passive structure.

15. The electronic device of claim 14, wherein:
the third passive structure is an inductor device;
the conductive vias include inductor vias;
the inductor vias comprise front sides and rear sides opposite to the front sides; and
the inductor device comprises inductor patterns coupled to one or more of the front sides or the rear sides of the inductor vias.

16. The electronic device of claim 10, wherein:
the conductive vias are disposed in the substrate body in an irregular array.

17. An electronic device, comprising:
a substrate comprising:
a substrate front side;
a substrate rear side opposite to the substrate front side;
a substrate body; and
conductive vias extending through the substrate body from the substrate front side to the substrate rear side;
a first construct over the substrate front side, comprising:
a first dielectric structure; and
first conductors embedded in the first dielectric structure and coupled to the conductive vias;
a second construct over the substrate rear side, comprising:
a second dielectric structure; and
second conductors embedded in the second dielectric structure and coupled to the conductive vias, wherein:

one or more of the first conductors or the second conductors define one or more passive devices; and an intermediate structure interposed between the first construct and the second construct comprising:
  an intermediate dielectric; and
  an intermediate passive device embedded in the intermediate dielectric;
  wherein:
    the intermediate passive device is coupled to the conductive vias; and
    the intermediate passive device is coupled to one or more of the first conductors or the second conductors.

18. The electronic device of claim 17, wherein:
the intermediate structure is adjacent to the substrate front side; and
the intermediate passive device comprises a capacitor device.

19. The electronic device of claim 17, wherein:
the intermediate structure is adjacent to the substrate rear side; and
the intermediate passive device comprises a capacitor device.

20. The electronic device of claim 17, wherein:
the first conductors define a first passive device;
the second conductors define a second passive device; and
one or more of the first passive device or the second passive device comprises an inductor device.

* * * * *